United States Patent
Lu et al.

(10) Patent No.: US 10,332,978 B2
(45) Date of Patent: Jun. 25, 2019

(54) DEVICE WITH REINFORCED METAL GATE SPACER AND METHOD OF FABRICATING

(71) Applicant: UNITED MICROELECTRONICS CORPORATION, Hsin-Chu (TW)

(72) Inventors: Chia-Lin Lu, Taoyuan (TW);
Yu-Cheng Tung, Kaohsiung (TW);
Chun-Lung Chen, Tainan (TW);
Kun-Yuan Liao, Hsinchu (TW);
Feng-Yi Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/689,780

(22) Filed: Aug. 29, 2017

(65) Prior Publication Data

US 2018/0006133 A1    Jan. 4, 2018

Related U.S. Application Data

(62) Division of application No. 14/924,479, filed on Oct. 27, 2015, now Pat. No. 9,780,193.

(51) Int. Cl.
| | |
|---|---|
| *H01L 29/66* | (2006.01) |
| *H01L 29/78* | (2006.01) |
| *H01L 23/485* | (2006.01) |
| *H01L 21/768* | (2006.01) |

(52) U.S. Cl.
CPC .... *H01L 29/6656* (2013.01); *H01L 21/76897* (2013.01); *H01L 23/485* (2013.01); *H01L 29/665* (2013.01); *H01L 29/6653* (2013.01); *H01L 29/66545* (2013.01); *H01L 29/66795* (2013.01); *H01L 29/7848* (2013.01); *H01L 29/7851* (2013.01); *H01L 21/76834* (2013.01); *H01L 29/66628* (2013.01)

(58) Field of Classification Search
CPC ... A01B 63/22; H01L 29/665; H01L 29/6653; H01L 29/66545; H01L 29/6656; H01L 29/66628; H01L 29/66795; H01L 29/7848; H01L 29/7851; Y10T 137/2516
USPC ........ 257/384, 288, 368, 408, 410; 438/592, 438/675, 585, 620, 595
See application file for complete search history.

(56) References Cited

U.S. PATENT DOCUMENTS

| | | | |
|---|---|---|---|
| 7,821,050 B1 * | 10/2010 | Liu ........................ | G11C 5/005 257/202 |
| 8,288,802 B2 * | 10/2012 | Cheng ................. | H01L 29/6656 257/288 |
| 8,481,415 B2 | 7/2013 | Yuan et al. | |
| 8,629,515 B2 * | 1/2014 | Yeh ................... | H01L 21/28105 257/249 |
| 2007/0087575 A1 * | 4/2007 | Iyer ..................... | H01L 21/0214 438/758 |

(Continued)

*Primary Examiner* — Mohammed Shamsuzzaman
(74) *Attorney, Agent, or Firm* — Winston Hsu

(57) ABSTRACT

A semiconductor device with reinforced gate spacers and a method of fabricating the same. The semiconductor device includes low-k dielectric gate spacers adjacent to a gate structure. A high-k dielectric material is disposed over an upper surface of the low-k dielectric gate spacers to prevent unnecessary contact between the gate structure and a self-aligned contact structure. The high-k dielectric material may be disposed, if desired, over an upper surface of the gate structure to provide additional isolation of the gate structure from the self-aligned contact structure.

15 Claims, 13 Drawing Sheets

(56) References Cited

U.S. PATENT DOCUMENTS

| | | | |
|---|---|---|---|
| 2010/0078733 A1* | 4/2010 | Masuoka | H01L 21/28088 257/384 |
| 2013/0175587 A1* | 7/2013 | Ramachandran | H01L 21/76895 257/288 |
| 2014/0361352 A1 | 12/2014 | Hung et al. | |
| 2015/0041868 A1 | 2/2015 | Cheng et al. | |
| 2015/0249036 A1* | 9/2015 | Cai | H01L 27/088 257/382 |
| 2015/0318178 A1* | 11/2015 | Pham | H01L 21/28 257/288 |
| 2015/0318345 A1* | 11/2015 | Xie | H01L 29/785 257/409 |
| 2018/0138176 A1* | 5/2018 | Shen | H01L 21/82347 |

* cited by examiner

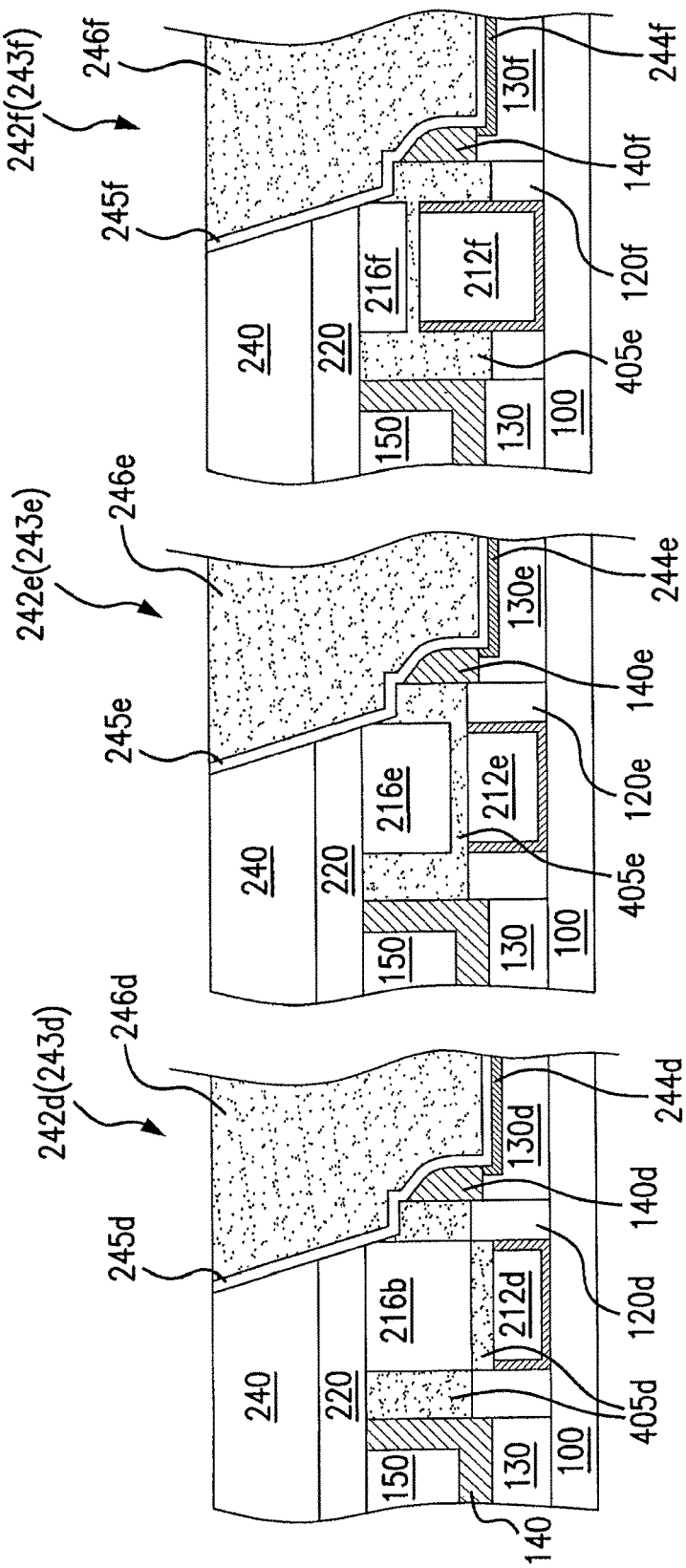

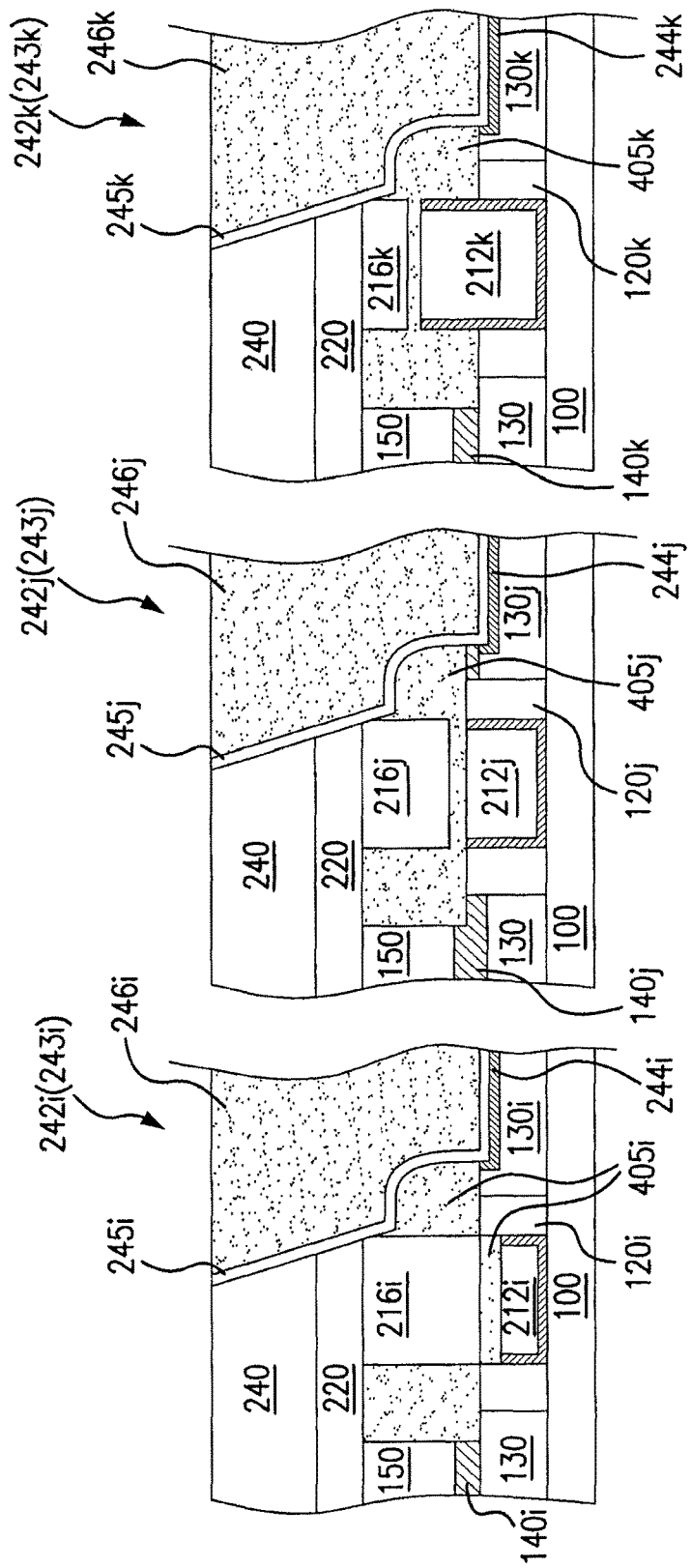

DEVICE WITH REINFORCED METAL GATE SPACER AND METHOD OF FABRICATING

CROSS REFERENCE TO RELATED APPLICATION

This application is a divisional of U.S. patent application Ser. No. 14/924,479, filed Oct. 27, 2015, the entire disclosure of which is incorporated herein by reference in its entirety.

BACKGROUND OF THE INVENTION

Field of the Invention

The present invention generally relates to semiconductor devices and methods of fabricating semiconductor devices. More particularly, the present invention relates to a semiconductor device with a reinforced metal gate spacer, and to a method of fabricating a semiconductor device with a reinforced metal gate spacer.

Semiconductor devices, such as field effect transistors (FETs), continue to be minimized. The trend of downscaling can be observed in various types of FETs, including a metal oxide semiconductor field effect transistor (MOSFET) and a complementary metal oxide semiconductor (CMOS). The miniaturization of semiconductor devices has led to various electrical and/or processing limitations, and manufacturers have developed various techniques for dealing with such limitations. For example, a transistor device with a polysilicon gate may exhibit disadvantageous boron penetration and depletion effects, which may result in inferior performance of the device. In order to deal with these drawbacks, some manufacturers adopt a gate-last process to replace the conventional polysilicon gate with a metal gate having a metal electrode. Moreover, to deal with shrinkage between adjacent gate structures, and drawbacks due to insufficient space between the adjacent structures, some manufacturers employ a method for self-aligning a contact structure.

For a transistor device having both a metal gate and a self-aligned contact structure, a mask layer is often formed to cover the metal gate prior to the formation of the self-aligned contact structure. The mask layer covering the metal gate prevents unnecessary contact between the metal gate and the self-aligned contact structure.

Known methods of fabricating a transistor having a metal gate and a self-aligned contact structure have drawbacks. For instance, steps for forming a self-aligned contact structure may include removing a mask layer covering the metal gate. With the miniaturization of semiconductor devices, however, there is an increased risk of unnecessary contact between the metal gate and the self-aligned contact structure.

The deficiencies of the prior art are overcome to a great extent by the inventions described herein.

SUMMARY OF THE INVENTION

According to an aspect of the present invention, a semiconductor device with a gate structure on a channel portion of a substrate, a low-k dielectric gate spacer adjacent to the gate structure, and a high-k dielectric material on at least an upper surface of the low-k dielectric gate spacer is provided. While high-k dielectric material has gained popularity as a dielectric material with the continued miniaturization of semiconductor devices, the use of high-k dielectric material directly on a silicon material may degrade the performance of such devices. The degradation may be caused by the fringing field effect developed from a gate to a source/drain of a semiconductor device. The present invention may be used to reinforce the gate spacer of a semiconductor device by disposing a high-k dielectric material over the low-k dielectric gate spacer disposed over a substrate. By preventing the high-k dielectric material adjacent to the gate structure from directly contacting the substrate, the induced electric field effect can be reduced.

According to yet another aspect of the present invention, a channel portion of a semiconductor device may be located between source and drain regions of the semiconductor device. The source and drain regions can be formed within a substrate or on an epitaxial layer formed over a substrate. In a finFET, where fin structures are formed on a substrate, the source and drain regions can be formed on the fin structures. It is yet another aspect of the present invention that a gate structure and its reinforced spacers are formed to cover the fin structures so that the gate structure may be present on the channel portion of the fin structures.

According to yet another aspect of the present invention, a mask material may be present on a semiconductor device. The mask material may be disposed on the semiconductor device to cover a gate structure, or a high-k dielectric material adjacent to or covering the gate structure. The high-k dielectric material, with a low-k dielectric gate spacer adjacent to the gate structure, may be part of a reinforced spacer of a semiconductor device. Alternatively, the mask material may be disposed on the semiconductor device to cover a gate structure and within inner sidewalls of a high-k dielectric material adjacent to the gate structure.

According to yet another aspect of the present invention, a self-aligned contact structure, adjacent to a high-k dielectric material, may be present on a semiconductor device to form a contact with a substrate or an epitaxial layer formed over the substrate.

According to yet another aspect of the present invention, a method of forming a semiconductor device is provided. The method includes forming a gate structure and a low-k dielectric gate spacer adjacent to the gate structure, recessing the low-k dielectric gate spacer to lower an upper surface of the low-k dielectric gate spacer relative to an upper surface of the gate structure, forming a high-k dielectric material on the upper surface of the low-k dielectric gate spacer, and forming a first interlayer dielectric layer adjacent to an outer sidewall of the high-k dielectric material or outer sidewalls of high-k dielectric material and low-k dielectric gate spacer.

Additional features and embodiments, as well as additional aspects, of the present invention may be set forth or apparent from consideration of the detailed description and drawings. Moreover, it is to be understood that both the foregoing summary of the disclosure and the following detailed description are exemplary and intended to provide further explanation without limiting the scope of the present invention.

Process steps, method steps, or the like, that are described in a sequential order herein may be configured to work in alternate orders. In other words, any sequence or order of steps that may be described does not necessarily indicate a requirement that the steps be performed in that order. The steps of the processes or methods described herein may be performed in any order practical. Further, some steps may be performed simultaneously.

BRIEF DESCRIPTION OF THE DRAWINGS

FIGS. 1-10 are schematic, cross-sectional diagrams showing a method for fabricating a semiconductor device according to an aspect of the present invention and a semiconductor formed according an aspect of the present invention, wherein:

FIG. 1 is a schematic diagram showing a semiconductor device at the beginning of the fabrication process;

FIG. 2 is a schematic diagram showing a semiconductor device after carrying out a replacement metal gate process;

FIG. 3 is a schematic diagram showing a semiconductor device after removing portions of low-k dielectric gate spacers;

FIG. 4 is a schematic diagram showing a semiconductor device after depositing a high-k dielectric material over the semiconductor device;

FIG. 5 is a schematic diagram showing a semiconductor device after removing upper portions of a high-k dielectric material;

FIG. 6 is a schematic diagram showing a semiconductor device after depositing a mask material over the semiconductor device;

FIG. 7 is a schematic diagram showing a semiconductor device after forming an interlayer dielectric layer over the semiconductor device;

FIG. 8 is a schematic diagram showing a semiconductor device after forming a contact hole;

FIG. 9 and FIG. 10 are schematic diagrams showing a semiconductor device after forming a self-aligned contact structure;

FIGS. 11-14 are schematic, cross-sectional diagrams showing a method for fabricating a semiconductor device according to yet another aspect or aspects of the present invention and a semiconductor device formed according to yet another aspect or aspects of the present invention, wherein:

FIG. 11 is a schematic diagram showing a semiconductor device after removing portions of an etch stop layer and low-k dielectric gate spacers;

FIG. 12 is a schematic diagram showing a semiconductor device after depositing a high-k dielectric material over the semiconductor device;

FIG. 13 is a schematic diagram showing a semiconductor device after removing upper portions of a high-k dielectric material;

FIG. 14 is a schematic diagram showing a semiconductor device after forming a self-aligned contact structure;

FIGS. 15-22 are schematic, cross-sectional diagrams showing a method for fabricating a semiconductor device according to yet another aspect or aspects of the present invention and a semiconductor device formed according to yet another aspect or aspects of the present invention, wherein:

FIG. 15 is a schematic diagram showing a semiconductor device after removing portions of low-k dielectric gate spacers and gate structures;

FIG. 16 is a schematic diagram showing a semiconductor device after depositing a high-k dielectric material over the semiconductor device;

FIG. 17 is a schematic diagram showing a semiconductor device after depositing a mask material over the semiconductor device;

FIG. 18 is a schematic diagram showing a semiconductor device after removing upper portions of a high-k dielectric material and a mask material;

FIG. 19 is a schematic diagram showing a semiconductor device after depositing a dielectric material;

FIGS. 20-22 are schematic diagrams showing semiconductor devices after forming self-aligned contact structures;

FIGS. 23-25 are schematic, cross-sectional diagrams showing semiconductor devices according to yet another aspect of the present invention;

FIG. 26 and FIG. 27 are schematic, cross-sectional diagrams showing a method for fabricating a semiconductor device according to yet another aspect of the present invention and a semiconductor formed according to yet another aspect of the present invention, wherein:

FIG. 26 is a schematic diagram showing a semiconductor device after depositing a dielectric material;

FIG. 27 is a schematic diagram showing semiconductor device after forming a self-aligned contact structure.

DETAILED DESCRIPTION

Figure 1:
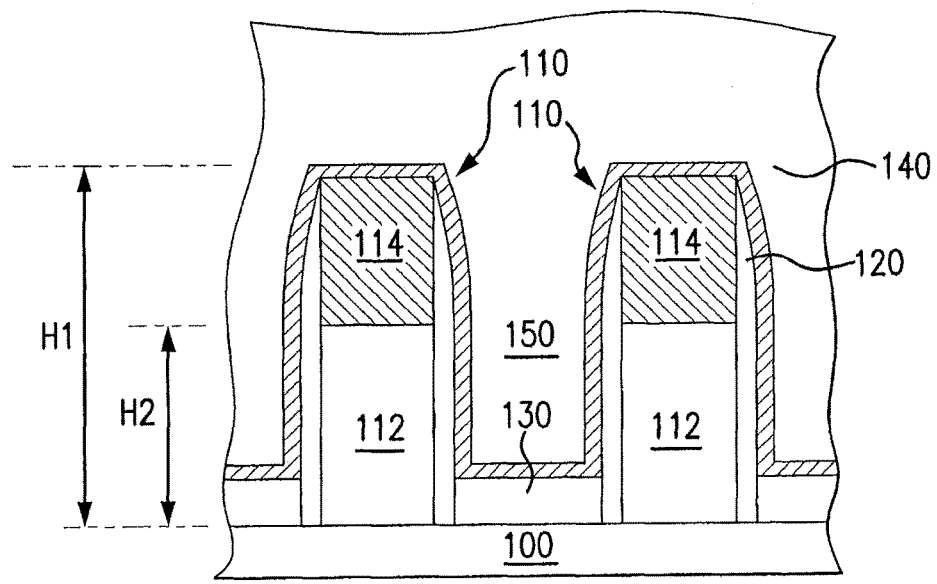

FIGS. 1-10 are schematic, cross-sectional diagrams showing a method of fabricating a semiconductor device according to an aspect of the present invention and a semiconductor formed according an aspect of the present invention. FIG. 1 is a schematic diagram showing a semiconductor device at the beginning of the fabrication process. As shown in FIG. 1, a substrate having stack structures, spacers, epitaxial layers, doped regions, cap layers and dielectric layers disposed thereon or therein is provided. The substrate 100 may be a semiconductor substrate with several optional protruding fin structures on its surface, but not limited thereto. The stack structures may be dummy gate structures 110 and each dummy gate structure 110 may include an interfacial layer (not shown), a sacrificial layer 112, and a cap layer 114 stacked from bottom to top. The spacers may be low-k dielectric gate spacers 120 respectively disposed on the sidewalls of each of the dummy gate structures 110. The epitaxial layers 130 are disposed inside or outside the substrate 100 and are respectively disposed on each side of the dummy gate structure 110, but not limited thereto. The doped regions (not shown) may be, for example, lightly-doped drains (LDD) and/or source/drain regions and are respectively disposed on each side of each dummy gate structure 110. Besides, the doped regions may be optionally located in the substrate 100 or the epitaxial layers 130, but not limited thereto. The cap layer and the dielectric layer may respectively correspond to an etch stop layer 140 and a first interlayer dielectric layer 150 and are sequentially stacked on the substrate 100. Additionally, the etch stop layer 140 may conformably cover the low-k dielectric gate spacers 120, the epitaxial layers 130, and the cap layer 114.

The above-mentioned substrate 100 may be selected from a silicon substrate, a silicon-germanium substrate or a silicon-on-insulator (SOI) substrate, but not limited thereto. In a case where the surface of the substrate 100 has protruding fin structures, the bottom of each dummy gate structure 110 may surround a section of the corresponding protruding fin structure to be present on the channel portion of the fin structure. A source region and a drain region may be formed on the fin structure so that the channel portion of the fin structure is in between the source and drain regions. The interfacial layer (not shown), the sacrificial layer 112, and the cap layer 114 in each dummy gate structure 110 may respectively correspond to an oxide layer, a silicon layer, and a nitride layer, for example a silicon oxide layer, a poly-silicon layer, and a silicon nitride layer, but not limited thereto. The low-k gate spacers 120 may be selected from a silicon oxide, a silicon nitride, a silicon carbide, a silicon carbon nitride, a silicon oxynitride, other suitable semiconductor compounds, or in their combination. The epitaxial layers 130 disposed at two sides of the dummy gate structures 110 may be selected from doped or un-doped semiconductor materials, such as silicon, silicon germanium, silicon phosphor, silicon carbon, or the like. The epitaxial layers 130 may impose required stress on channel regions of the semiconductor device and accordingly improve the carrier mobility in the channel regions. The etch stop layer 140 may be selected from a silicon carbon nitride, a silicon oxynitride, a silicon nitride, a silicon carbide, or other suitable semiconductor compounds. The etch stop layer 140 may also impose required stress on the channel regions and/or act as an etch stop layer during a subsequent process for forming a contact structure. The first interlayer dielectric layer 150 may be selected from non-conductive dielectric materials, such as silicon oxide or the like.

At this stage, there is a first height H1 between the top surface of each cap layer 114 and that of the substrate 100, while there is a second height H2 between the top surface of the sacrificial layer 112 and that of the substrate 100. The first height H1 approximately ranges from 1000 Angstrom to 2000 Angstrom and preferably is about 1300 Angstrom. The second height H2 approximately ranges from 700 Angstrom to 1200 Angstrom and preferably is about 900 Angstrom.

Subsequently, a polishing process and/or an etching process is carried out, such as a chemical mechanical polishing process, to remove the cap layer 114 completely until the upper surface of the sacrificial layers 112 is exposed. In this process, since a portion of the sacrificial layer 112 in each dummy gate structure 110 may be removed, a height between the top surface of each sacrificial layer 112 and that of the substrate 100 may be slightly reduced.

Figure 2:
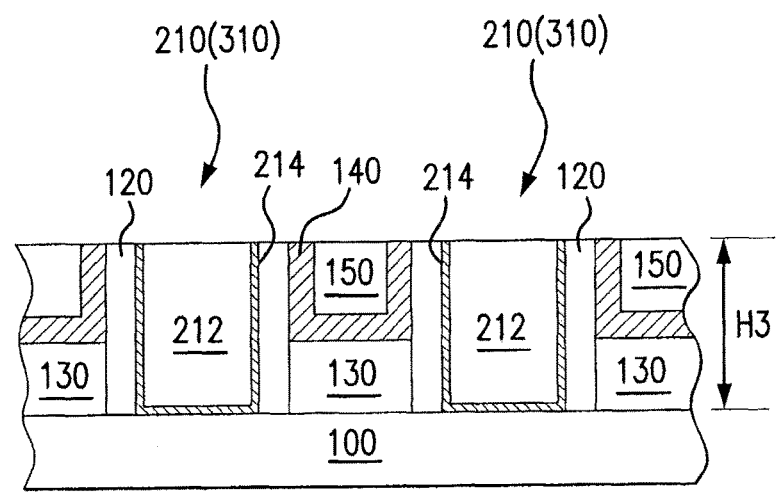

FIG. 2 is a schematic diagram showing a semiconductor device after carrying out a replacement metal gate process. After the exposure of the upper surface of the sacrificial layer 112, a replacement metal gate (RMG) process may be carried out so as to form the structure shown in FIG. 2. The process may at least include the following steps. First, the sacrificial layer 112 within each dummy gate structure 110 is removed to leave a trench 210. Then, a dielectric layer 214, a work function metal layer (not shown), and a conductive layer are sequentially filled into the trench 210. A polishing process is carried out afterward to remove the upper portions of dielectric layer 214, the work function metal layer, and the conductive layer outside the trench 210 until the first interlayer dielectric layer 150 is exposed. At this time, several metal gate structures 310 are obtained and a conductive layer in each trench 210 may act as a gate electrode 212 of a gate structure 310.

While the gate structure described in FIG. 2 comprises a work function metal layer and a conductive layer, it may also be replaced with a poly-silicon gate (not shown). The poly-silicon gate, according to an aspect of the present invention, may include an oxide interfacial layer disposed over the substrate and a poly-silicon material disposed over the oxide interfacial layer.

According to FIG. 2, the upper surface of the gate electrode 212 is preferably substantially leveled to that of the first interlayer dielectric layer 150. Height H3 represents the height of the gate electrode 212 and a dielectric layer 214 from the substrate 100. The above-mentioned polishing process may not only remove the conductive layers, but also a portion of the low-k dielectric gate spacers 120, the etch stop layer 140, and the first interlayer dielectric layer 150. Accordingly, the third height H3 may be slightly lower than the second height H2. The difference between the heights may range from 50 Angstrom to 300 Angstrom, preferably about 150 Angstrom. In addition, the upper surface of each gate electrode 212 may be slightly lower than that of the low-k dielectric gate spacers 120, the etch stop layer 140 and the first interlayer dielectric layer 150, but not limited thereto.

The dielectric layer 214 is preferably a high-k dielectric material with a dielectric constant substantially greater than 20, but is not limited thereto. For instance, when the gate structure comprises a poly-silicon material, the dielectric layer 214 may comprise a low-k dielectric material.

The dielectric layer 214 comprising a high-k dielectric material may be selected from the group consisting of hafnium oxide ($HfO_2$), hafnium silicon oxide (HfSiO), hafnium silicon oxynitride (HfSiON), aluminum oxide ($Al_2O_3$), lanthanum oxide ($La_2O_3$), lanthanum aluminum oxide (LaAlO), tantalum oxide (TaZOS), zirconium oxide (ZrOZ), zirconium silicon oxide ($ZrSiO_4$), hafnium Zirconium oxide (HerO), strontium bismuth tantalite ($SrBi_2Ta_2Og$, SBT), lead zirconate titanate ($PbZrTi_{1-x}O_3$, PZT), and barium strontium titanatev ($BaxSr_{1-x}TiO_3$, BST), and/or other suitable materials. Although not shown, one or more additional interfacial layers may be disposed between the dielectric layer 214 and the substrate, such as an oxide layer.

Additionally, the work function metal layers may include titanium nitride (TiN), titanium carbide (TiC), tantalum nitride (TaN), tantalum carbide (TaC), tungsten carbide (WC), or aluminum titanium nitride (TiAlN), and/or other suitable materials. The gate electrodes 212 may include metal or metal oxide with superior filling ability and relative low resistance, such as aluminum (Al), titanium aluminum (TiAl), titanium aluminum oxide (TiAlO), tungsten (W), or copper (Cu), and/or other suitable materials.

The above-mentioned process is a gate-last process accompanied with a high-k last process, wherein both the dielectric layer 214 and the work function layer are preferably disposed on the sidewalls and the bottom of each trench 210.

According to yet another aspect of the present invention, the gate structure 310, including the dielectric layer 214 and the gate electrode 212, the low-k dielectric gate spacer 120 adjacent to the gate structure 310, the epitaxial layer 130, the etch stop layer 140, and the first interlayer dielectric layer 150 may be formed according to a gate-first process accompanied with a high-k first process instead.

The term "adjacent" used to describe an aspect of the present invention may mean "next to," "adjoining," "near," "facing," or "having a common side." For instance, a low-k dielectric gate spacer adjacent to a gate structure may be next to and in direct contact with a gate structure. Alternatively, a low-k dielectric gate spacer may be next to yet not in direct contact with a gate structure. An interfacial layer of different dielectric material may be formed between the low-k dielectric gate spacer and the gate structure.

Figure 3:
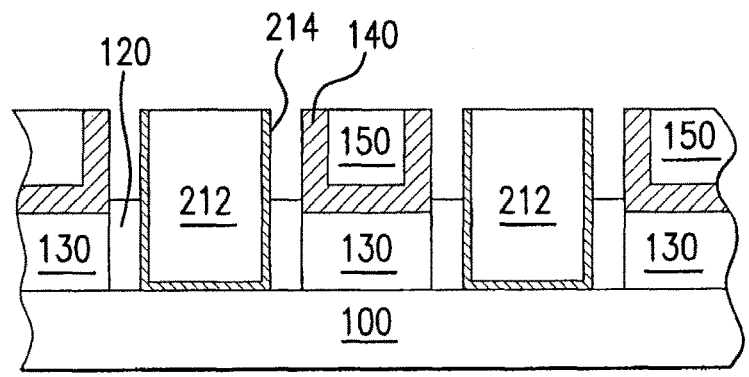

FIG. 3 is a schematic diagram showing the device after the removal of portions of low-k dielectric gate spacers 120. While FIG. 3 illustrates the removal of only the low-k dielectric gate spacers 120, etch stop layer 140 may also be recessed so that the upper surfaces of the low-k dielectric gate spacers 120 and the etch stop layer 140 are substantially leveled, as described below in relation to FIGS. 11-14. A photolithographic process or an etching process may be implemented to selectively remove portions of the low-k dielectric gate spacers 120, or portions of the low-k dielectric gate spacers 120 with the etch stop layer 140.

Figure 4:
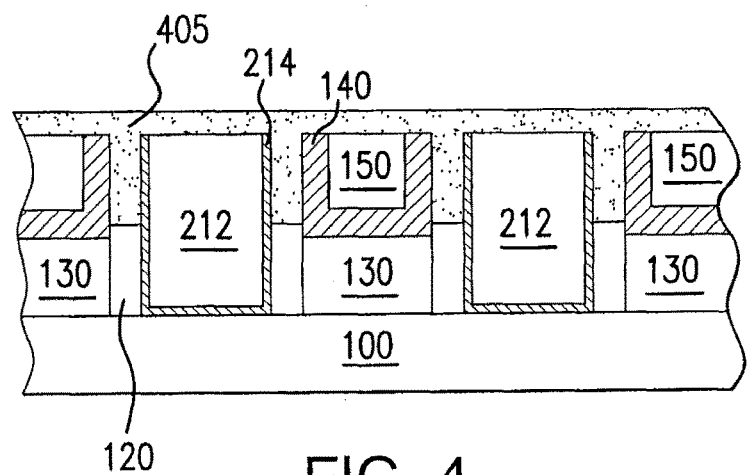

FIG. 4 is a schematic diagram showing a semiconductor device after depositing a high-k dielectric material 405 over the device and, in particular, over an upper surface of the low-k dielectric gate spacers 120. A deposition process, such as atomic layer deposition process, may be carried out to form the high-k dielectric material 405. The high-k dielectric material 405 may be selected from the group consisting of hafnium oxide ($HfO_2$), hafnium silicon oxide (HfSiO), hafnium silicon oxynitride (HfSiON), aluminum oxide ($Al_2O_3$), lanthanum oxide ($La_2O_3$), lanthanum aluminum oxide (LaAlO), tantalum oxide (TaZOS), zirconium oxide (ZrOZ), zirconium silicon oxide ($ZrSiO_4$), hafnium Zirconium oxide (HerO), strontium bismuth tantalite ($SrBi_2Ta_2Og$, SBT), lead zirconate titanate ($PbZrTi_{1-x}O_3$, PZT), and barium strontium titanatev ($Ba_xSr_{1-x}TiO_3$, BST), but not limited thereto.

Figure 5:
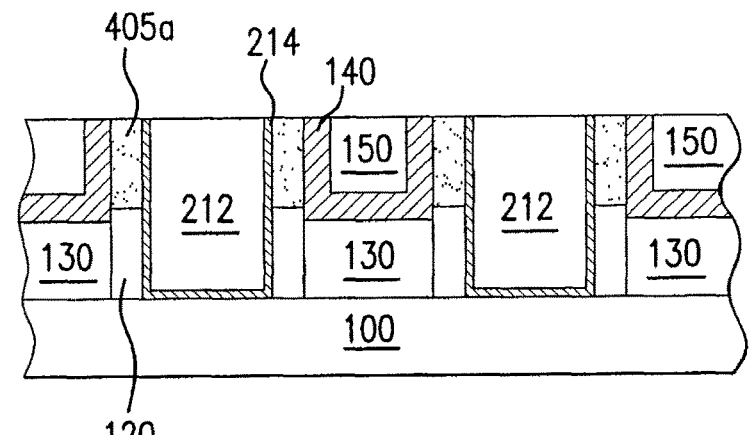

FIG. 5 is a schematic diagram showing a semiconductor device after removing upper portions of the high-k dielectric material 405. An etching process selectively removing the high-k dielectric material may be implemented. Alternatively, a chemical-mechanical polishing (CMP) process may be implemented. As illustrated, the upper portions of a high-k dielectric material are removed so that the remaining portions of the high-k dielectric material 405a are substantially leveled with the first interlayer dielectric layer 150 and the etch stop layer 140.

Figure 6:
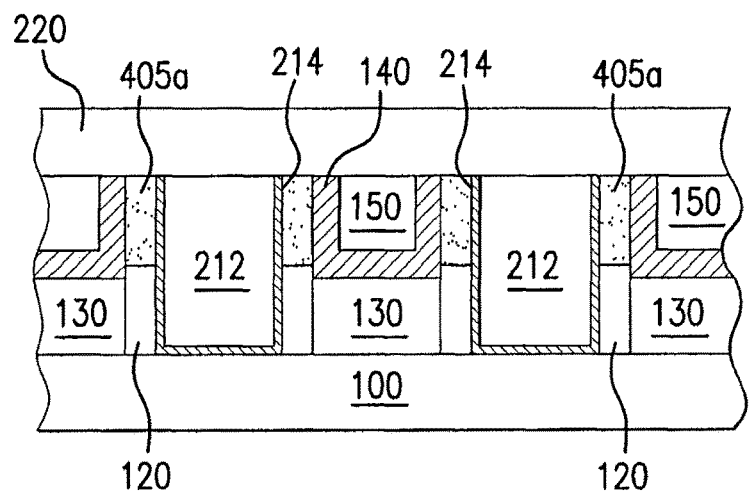

FIG. 6 is a schematic diagram showing a semiconductor device after a deposition of a mask layer 220. A deposition process, such as a chemical vapor deposition process, may be implemented to form a mask layer 220 with a thickness ranging from 200 Angstrom to 400 Angstrom, and preferably about 350 Angstrom. The mask layer 220 may completely cover the gate electrodes 212, the high-k dielectric material 405a, the etch stop layer 140, and the first interlayer dielectric layer 150. Preferably, the composition of the mask layer 220 may include a silicon carbon nitride, a silicon oxynitride, a silicon nitride, or a silicon carbide, which is different from that of the first interlayer dielectric layer 150. In this way, a required etching selectivity may be defined among these layers.

Figure 7:
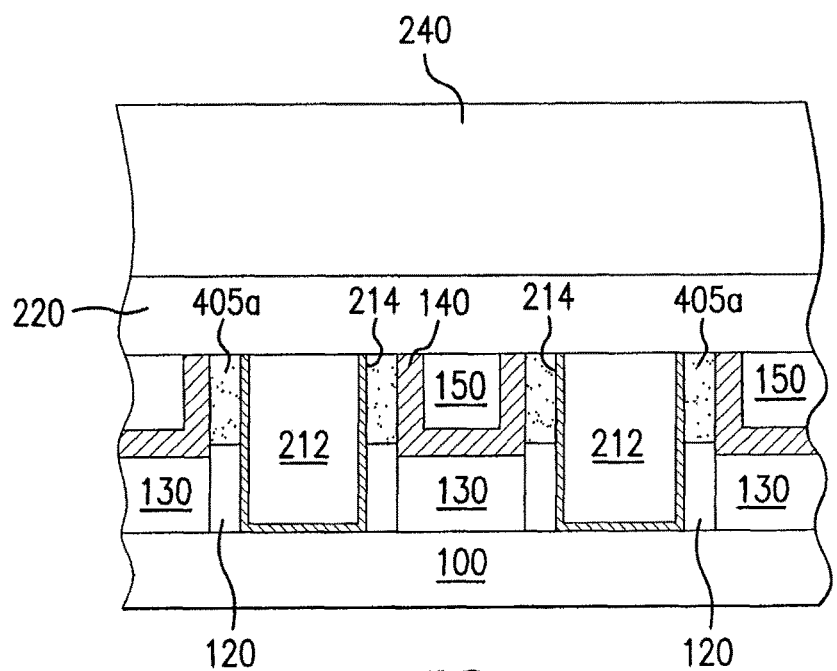

FIG. 7 is a schematic diagram showing a semiconductor device after a deposition of a second interlayer dielectric layer 240. After the formation of the mask layer 220, the second interlayer dielectric layer 240, such as a pre-metal dielectric (PMD), may be deposited blankly to completely cover the mask layer 220. The composition of the second interlayer dielectric layer 240 may be similar to that of the first interlayer dielectric layer 150, such as a silicon oxide, so that there are the same or similar etching rates between the two layers.

Figure 8:
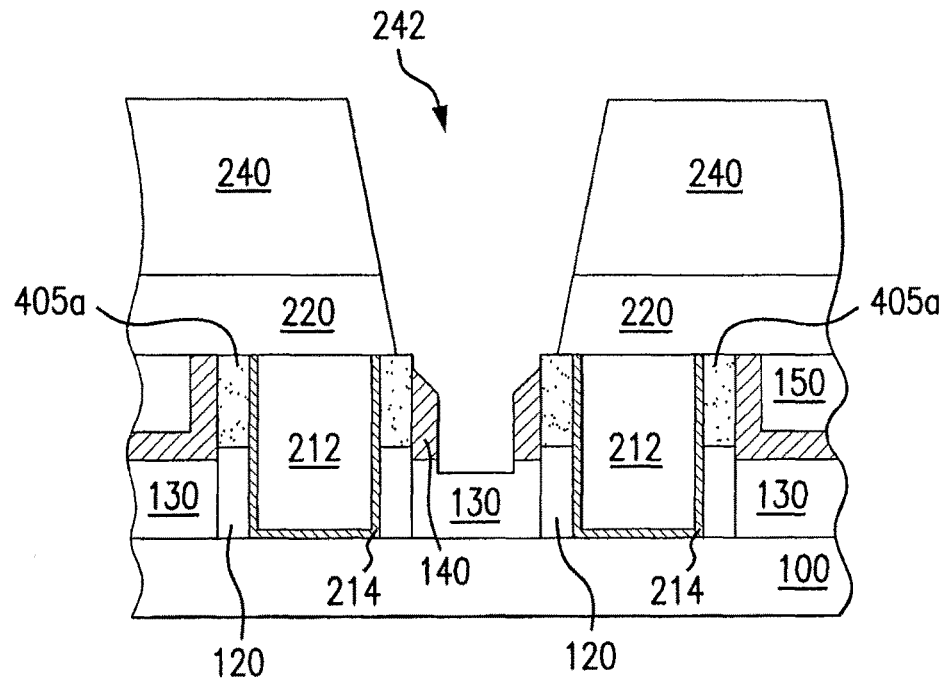

FIG. 8 is a schematic diagram showing a semiconductor device after forming a contact hole. A photolithographic process and an etching process may be carried out to form a contact hole 242 in the second interlayer dielectric layer 240, the mask layer 220, and the first interlayer dielectric layer 150. The contact hole 242 may expose the epitaxial layers 130 or the substrate 100 disposed between each of the gate electrodes 212. According to an aspect of the present invention, there is a certain etching selectivity among the mask layer 220, high-k dielectric material 405a, the low-k dielectric gate spacers 120, the etch stop layer 140, the second interlayer dielectric layer 240, and the first interlayer dielectric layer 150. For instance, with the selected etchants and etching recipes, the etching rate of the mask layer 220, the high-k dielectric material 405a, the low-k dielectric gate spacers 120, and the etch stop layer 140 may be lower than the etching rate of the second interlayer dielectric layer 240 and the first interlayer dielectric layer 150. Accordingly, only a small amount of the mask layer 220, the high-k dielectric material 405a, the low-k dielectric gate spacers 120, and the etch stop layer 140 may be removed during the etching process. Thus, even if a misalignment occurs during the photolithographic process, the contact hole 242 may only expose the epitaxial layer 130 or the substrate 100 rather than the gate electrodes 212. The etchants described above may be chosen from suitable gas etchants, such as $C_4F_6$, $C_5F_8$, $O_2$, Ar, CO, $CH_2F_2$ or the mixture thereof, but not limited thereto.

Figure 9:
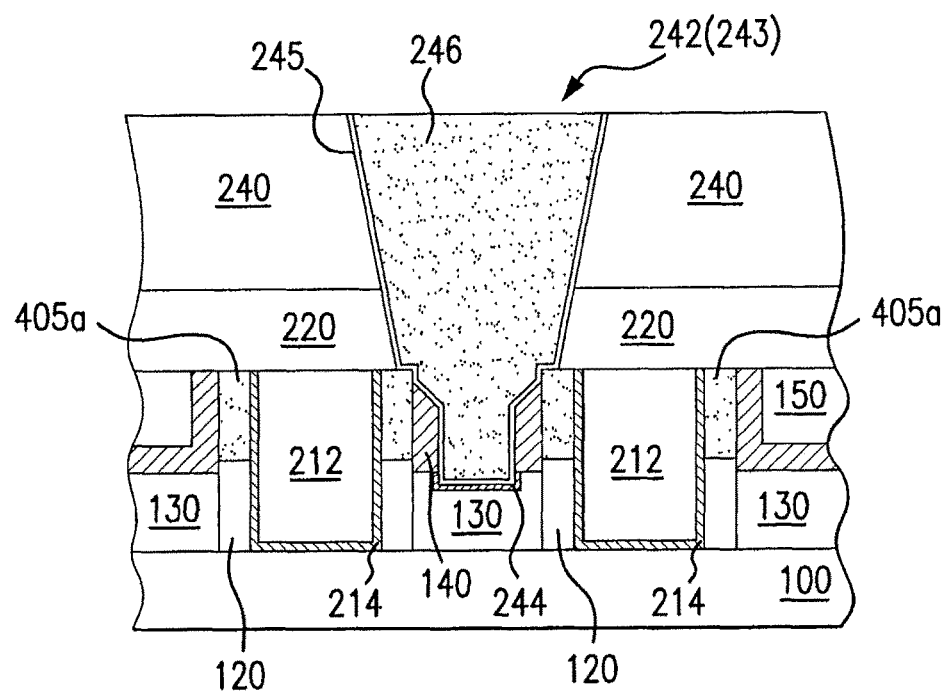

FIG. 9 is a schematic diagram showing a structure after the formation of a contact structure according to an aspect embodiment of the present invention. As shown in FIG. 9, a self-aligned silicidation process is carried out to form a metal silicide 244 in the epitaxial layer 130. Subsequently, a self-aligned contact process is performed to fill a barrier layer 245 and a metal layer 246 into the contact hole 242 so as to form a self-aligned contact structure 243. The self-aligned contact structure 243 may, if desired, directly contact the mask layer 220, the high-k dielectric material 405a, the low-k dielectric gate spacers 120, the etch stop layer 140, the second interlayer dielectric layer 240, and the first interlayer dielectric layer 150, and electrically connect the underneath metal silicide 244. Alternatively, the self-aligned contact structure may form a contact with the substrate, wherein a metal silicide is formed at the interface of the self-aligned contact structure and the substrate.

The metal silicide 244 may be a silicide, and a metal element of the silicide may be selected from the group consisting of tungsten (W), aluminum (Al), copper (Cu), titanium (Ti), tantalum (Ta), niobium (Nb), erbium (Er), molybdenum (Mo), cobalt (Co), nickel (Ni), platinum (Pt), or alloys thereof. The self-aligned contact structure 243 may be selected from the group consisting of tungsten (W), aluminum (Al), titanium (Ti), copper (Cu), molybdenum (Mo), cobalt (Co), platinum (Pt), or alloys thereof. The barrier layer 245 includes titanium nitride (TiN), tantalum nitride (TaN), Ti/TiN, or Ta/TaN, but is not limited thereto.

Figure 10:
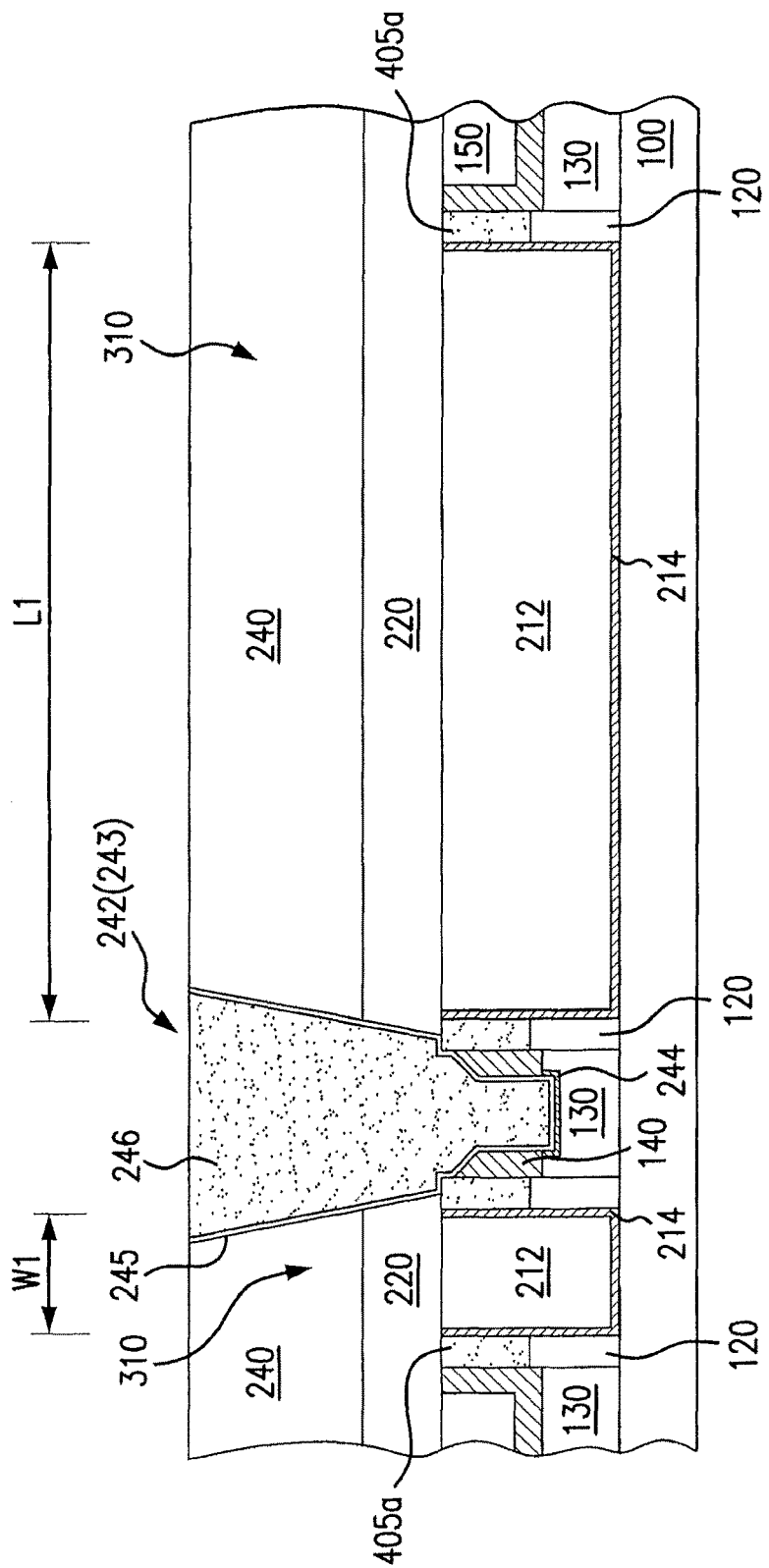

FIG. 10 is schematic diagram showing a semiconductor device after forming a contact structure. The processing time and the structure of the semiconductor device illustrated in FIG. 10 correspond to those of FIG. 9. FIG. 10, however, illustrates a cross-sectional diagram of both a short axis and a long axis of the metal gate structure 310. As shown in FIG. 10, the metal gate structure 310 on the left side has a first width W1 similar to the first width W1 shown in FIG. 9, while the metal gate structure 310 on the right side of FIG. 10 has a first length L1 longer than the first width W1. According to an aspect of the present invention, the first length L1 may be about five times longer than the first width W1.

According to an aspect of the present invention, the mask layer 220 is formed through a deposition process. Since there is no need to remove an upper portion of the gate electrode 212 and polish the gate electrode 212 during or after the process of forming the mask layer 220, the difference in height between the initial dummy gate structure 110 and the final metal gate structure 310 may be reduced. Accordingly, the height of the dummy gate structure 110 at the beginning of the fabrication process may be effectively reduced and the height of the subsequent trench 210 may also be reduced. Therefore, a potential drawback of the dummy gate structure 110 being prone to break may be overcome, the shadowing effect caused by the dummy gate structure 110 during the ion implantation process may be avoided, and the capability of filling the first interlayer dielectric layer 150 and the conductive layer respectively into each dummy gate structure 110 and each trench 210 may all be improved.

Furthermore, since there is no need to remove the upper portion of the gate electrode 212, even though there are defects, such as void defects, existing in the gate electrode 212, etchants are still not able to reach and damage the structure under the gate electrode 212, such as dielectric layer or substrate, through the defect. This increases the yield rate of the fabrication process.

Additionally, since the mask layer 220 is optionally further disposed, even though the position of each initial dummy gate structure 110 slightly shifts, or the subsequent contact hole 242 is misaligned, the mask layer 220 may amend this deviation. In other words, the mask layer 220 may completely cover the underneath corresponding gate electrode 212. Accordingly, the non-necessary electrical contact between the self-aligned contact structure 243 and the gate electrode 212 may be avoided.

FIGS. 11-14 are schematic, cross-sectional diagrams showing a method for fabricating a semiconductor device according to yet another aspect or aspects of the present invention and a semiconductor device formed according to yet another aspect or aspects of the present invention. To the extent the description accompanying FIGS. 1-10 is applicable to FIGS. 11-14, the description may be applied to the aspect or aspects of the present invention illustrated in FIGS. 11-14.

Figure 11:
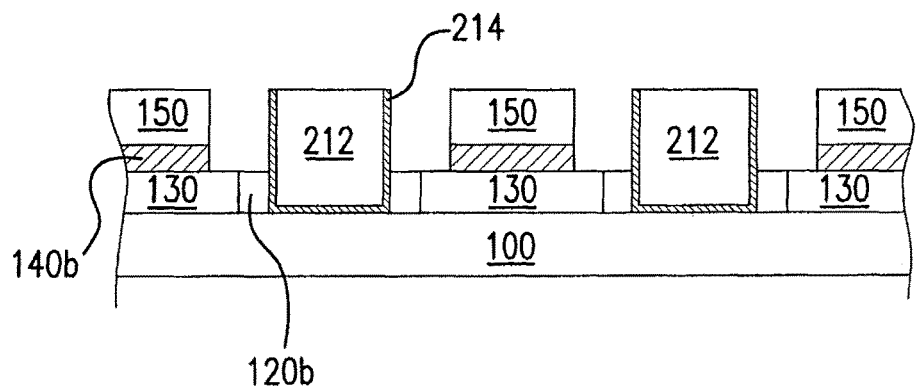

For instance, after the formation of the substrate 100, the low-k dielectric gate spacers 120, the epitaxial layer 130, the etch stop layer 140, the first interlayer dielectric layer 150, and the gate structure 310, including a gate electrode 212 and a dielectric layer 140, as illustrated above in FIG. 1 and FIG. 2 and according to the methods and processes described in the texts related to FIG. 1 and FIG. 2, portions of the low-k dielectric gate spacers 120 and etch stop layer 140 may be removed as illustrated in FIG. 11.

FIG. 11 illustrates recessed etch stop layer 140b and low-k dielectric gate spacers 120b. After the recess, the upper surface of the epitaxial layer 130 is exposed and the upper surface of the low-k dielectric gate spacers 120b substantially level the upper surface of the epitaxial layer 130. However, the aspect of the present invention illustrated in FIG. 11 is not limited to such. For instance, the etch stop layer 140 and low-k dielectric gate spacers 120 may be recessed so that the upper surface of the recessed etch stop layer and low-k dielectric gate spacers are higher than the upper surface of the epitaxial layer 130.

Figure 12:
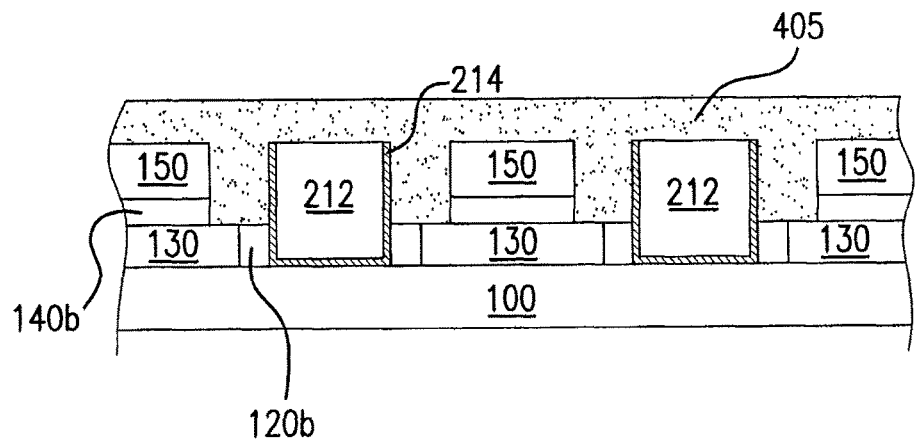

FIG. 12 is a schematic diagram showing a semiconductor device after depositing a high-k dielectric material 405 over the device and, in particular, over an upper surface of the exposed epitaxial layer 130 and an upper surface of the low-k dielectric gate spacers 120b that are exposed. A deposition process, such as atomic layer deposition process, may be carried out to form the high-k dielectric material 405. The high-k dielectric material 405 may be selected from the group consisting of hafnium oxide ($HfO_2$), hafnium silicon oxide (HfSiO), hafnium silicon oxynitride (HfSiON), aluminum oxide ($Al_2O_3$), lanthanum oxide ($La_2O_3$), lanthanum aluminum oxide (LaAlO), tantalum oxide (TaZOS), zirconium oxide (ZrOZ), zirconium silicon oxide ($ZrSiO_4$), hafnium Zirconium oxide (HerO), strontium bismuth tantalite ($SrBi_2Ta_2Og$, SBT), lead zirconate titanate ($PbZrTi_{1-x}O_3$, PZT), and barium strontium titanatev ($Ba_xSr_{1-x}TiO_3$, BST), but not limited thereto.

Figure 13:
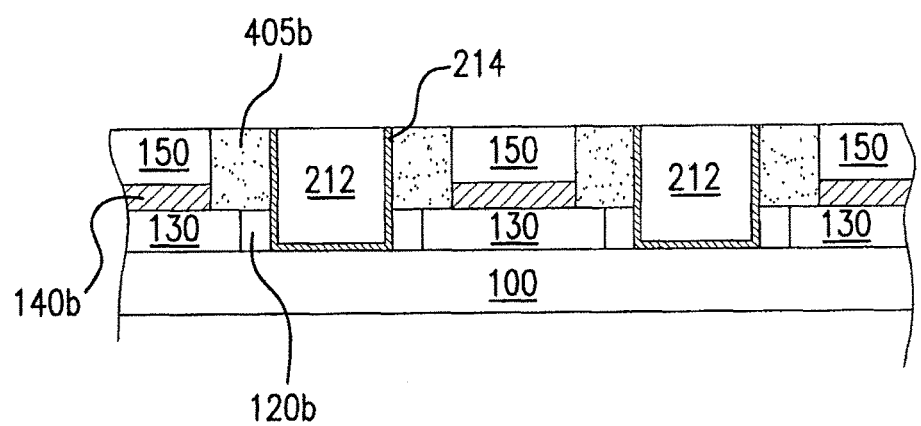

FIG. 13 is a schematic diagram showing a semiconductor device after removing upper portions of the high-k dielectric material 405. An etching process selectively removing the high-k dielectric material may be implemented. Alternatively, a chemical-mechanical polishing (CMP) process may be implemented. As illustrated, the upper portions of a high-k dielectric material are removed so that the remaining portions of the high-k dielectric material 405b are substantially leveled with the first interlayer dielectric layer 150.

Figure 14:
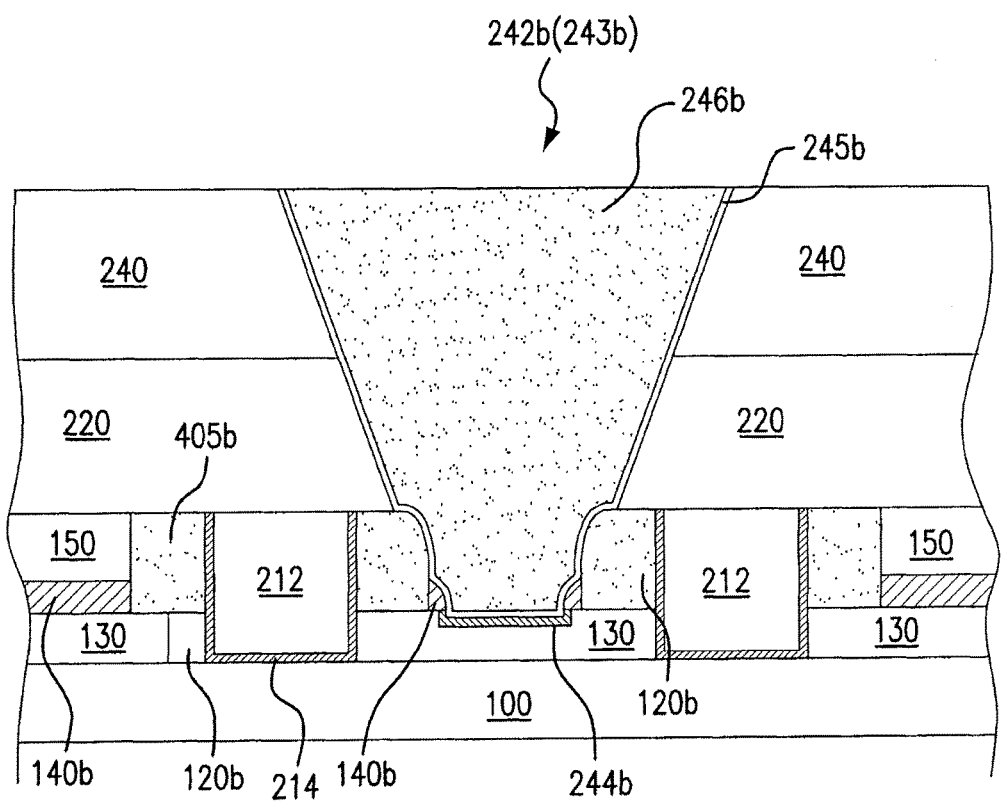

FIG. 14 is a schematic diagram showing a semiconductor device after forming a contact hole 242b. After the leveling of the high-k dielectric material 405b with the first interlayer dielectric layer 150, a deposition process, such as a chemical deposition process, may be implemented to form a mask layer 220 with a thickness ranging from 200 Angstrom to 400 Angstrom, and preferably about 350 Angstrom. The mask layer 220 may completely cover the gate electrodes 212, the high-k dielectric material 405b, and the first interlayer dielectric layer 150. Preferably, the composition of the mask layer 220 may include a silicon carbon nitride, a silicon oxynitride, a silicon nitride, or a silicon carbide, which is different from that of the first interlayer dielectric layer 150. In this way, a required etching selectivity may be defined among these layers.

After the formation of the mask layer 220, the second interlayer dielectric layer 240, such as a pre-metal dielectric (PMD), may be deposited blankly to completely cover the mask layer 220. The composition of the second interlayer dielectric layer 240 may be similar to that of the first interlayer dielectric layer 150, such as a silicon oxide, so that there are the same or similar etching rates between the two layers.

A photolithographic process and an etching process may be carried out to form a contact hole 242b in the second interlayer dielectric layer 240, the mask layer 220, and the first interlayer dielectric layer 150. The contact hole 242b may expose the epitaxial layers 130 or the substrate 100 disposed between each of the gate electrodes 212. According to an aspect of the present invention, there is a certain etching selectivity among the mask layer 220, high-k dielectric material 405b, the low-k dielectric gate spacers 120b, the etch stop layer 140b, the second interlayer dielectric layer 240, and the first interlayer dielectric layer 150. For instance, with the selected etchants and etching recipes, the etching rate of the mask layer 220, the high-k dielectric material 405b, the low-k dielectric gate spacers 120b, and the etch stop layer 140b may be lower than the etching rate of the second interlayer dielectric layer 240 and the first interlayer dielectric layer 150. Accordingly, only a small amount of the mask layer 220, the high-k dielectric material 405b, the low-k dielectric gate spacers 120b, and the etch stop layer 140b may be removed during the etching process. Thus, even if a misalignment occurs during the photolithographic process, the contact hole 242 may only expose the epitaxial layer 130 or the substrate 100 rather than the gate electrodes 212. The etchants described above may be chosen from suitable gas etchants, such as $C_4F_6$, $C_5F_8$, $O_2$, Ar, CO, $CH_2F_2$ or the mixture thereof, but not limited thereto.

A self-aligned silicidation process is carried out to form a metal silicide 244b in the epitaxial layer 130. Subsequently, a self-aligned contact process is performed to fill a barrier layer 245b and a metal layer 246b into the contact hole 242b so as to form a self-aligned contact structure 243b. The self-aligned contact structure 243b may, if desired, directly contact the mask layer 220, the high-k dielectric material 405b, the low-k dielectric gate spacers 120b, the etch stop layer 140b, the second interlayer dielectric layer 240, and the first interlayer dielectric layer 150, and electrically connect the underneath metal silicide 244b. Alternatively, the self-aligned contact structure may form a contact with the substrate, wherein a metal silicide is formed at the interface of the self-aligned contact structure and the substrate.

The metal silicide 244b may be a silicide, and a metal element of the silicide may be selected from the group consisting of tungsten (W), aluminum (Al), copper (Cu), titanium (Ti), tantalum (Ta), niobium (Nb), erbium (Er), molybdenum (Mo), cobalt (Co), nickel (Ni), platinum (Pt), or alloys thereof. The self-aligned contact structure 243b may be selected from the group consisting of tungsten (W), aluminum (Al), titanium (Ti), copper (Cu), molybdenum (Mo), cobalt (Co), platinum (Pt), or alloys thereof. The barrier layer 245b includes titanium nitride (TiN), tantalum nitride (TaN), Ti/TiN, or Ta/TaN, but is not limited thereto.

FIGS. 15-22 are schematic, cross-sectional diagrams showing a method for fabricating a semiconductor device according to yet another aspect or aspects of the present invention and a semiconductor formed according to yet another aspect or aspects of the present invention. To the extent the description accompanying FIGS. 1-10 is applicable to FIGS. 15-22, the description may be applied to the aspect or aspects of the present invention illustrated in FIGS. 15-22.

For instance, after the formation of the substrate 100, the low-k dielectric gate spacers 120, the epitaxial layer 130, the etch stop layer 140, the first interlayer dielectric layer 150, and the gate structure 310, including a gate electrode 212 and a dielectric layer 140, as illustrated above in FIG. 1 and FIG. 2 and according to the methods and processes described in the texts related to FIG. 1 and FIG. 2, portions of the gate electrode 212 and the dielectric layer 214 of the gate structure 310 may be removed with the low-k dielectric gate spacers 120.

Figure 15:
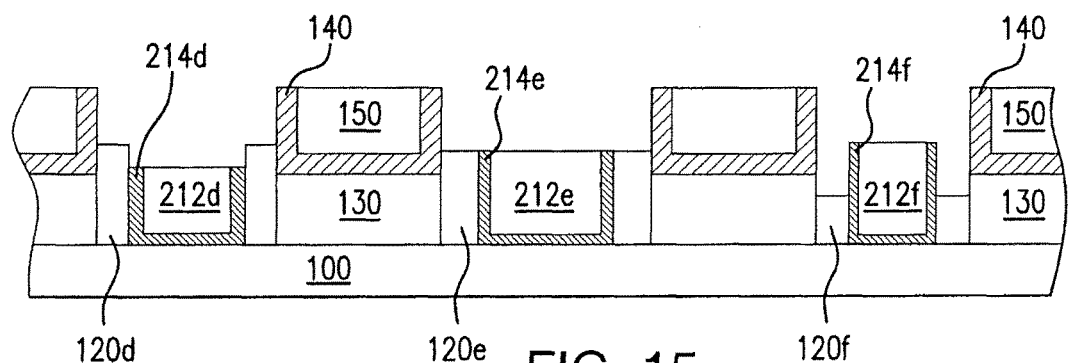

FIG. 15 illustrates the low-k dielectric spacers and gate structures, including gate electrodes and dielectric layers, after their removal according to an aspect or aspects of the present invention. For instance, a gate electrode 212d and dielectric layer 214d may be recessed more than the low-k dielectric gate spacer 120d so that an upper surface of the gate electrode 212d and the dielectric layer 214d is lower than an upper surface of the low-k dielectric gate spacer 120d. Alternatively, a gate electrode 212e and dielectric layer 214e may be recessed as much as the low-k dielectric gate spacer 120e so that an upper surface of the gate electrode 212e and the dielectric layer 214e is substantially level to an upper surface of the low-k dielectric gate spacer 120e. Alternatively, a gate electrode 212f and dielectric layer 214f may be recessed less than the low-k dielectric gate spacer 120f so that an upper surface of the gate electrode 212f and the dielectric layer 214f is higher than an upper surface of the low-k dielectric gate spacer 120f.

While FIG. 15 illustrates the removal of only the low-k dielectric gate spacers and the gate structures, etch stop layer 140 may also be recessed so that the upper surfaces of the recessed low-k dielectric gate spacers and the recessed etch stop layer are substantially leveled, as described below in relation to FIGS. 23-25. A photolithographic process or an etching process may be implemented to selectively remove portions of low-k dielectric gate spacers 120, gate electrode 212, and dielectric layer 214 of FIG. 2, or portions of low-k dielectric gate spacers 120, gate electrode 212, and dielectric layer 214 with the etch stop layer 140 of FIG. 2.

Figure 16:
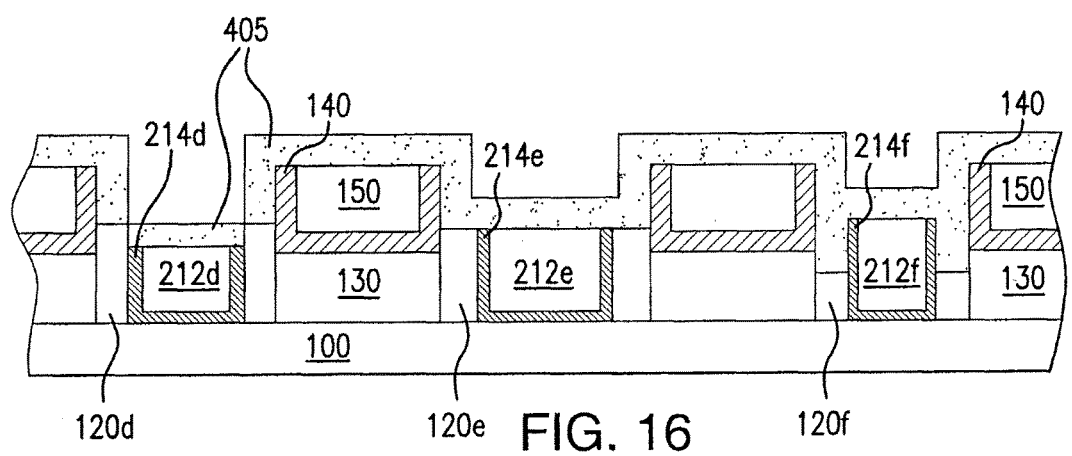

FIG. 16 is a schematic diagram showing a semiconductor device after depositing a high-k dielectric material 405 over the semiconductor device, in particular, over an upper surface of the first interlayer dielectric layer 150, low-k dielectric gate spacers 120d, 120e, 120f, gate electrodes 212d, 212e, 212f, and dielectric layers 214d, 214e, 214f. A deposition process, such as physical vapor deposition process, may be carried out to form the high-k dielectric material 405. The high-k dielectric material 405 may be selected from the group consisting of hafnium oxide ($HfO_2$), hafnium silicon oxide (HfSiO), hafnium silicon oxynitride (HfSiON), aluminum oxide ($Al_2O_3$), lanthanum oxide ($La_2O_3$), lanthanum aluminum oxide (LaAlO), tantalum oxide (TaZOS), zirconium oxide (ZrOZ), zirconium silicon oxide ($ZrSiO_4$), hafnium Zirconium oxide (HerO), strontium bismuth tantalite ($SrBi_2Ta_2Og$, SBT), lead zirconate titanate ($PbZrTi_{1-x}O_3$, PZT), and barium strontium titanatev ($Ba_x Sr_{1-x}TiO_3$, BST), but not limited thereto.

Figure 17:
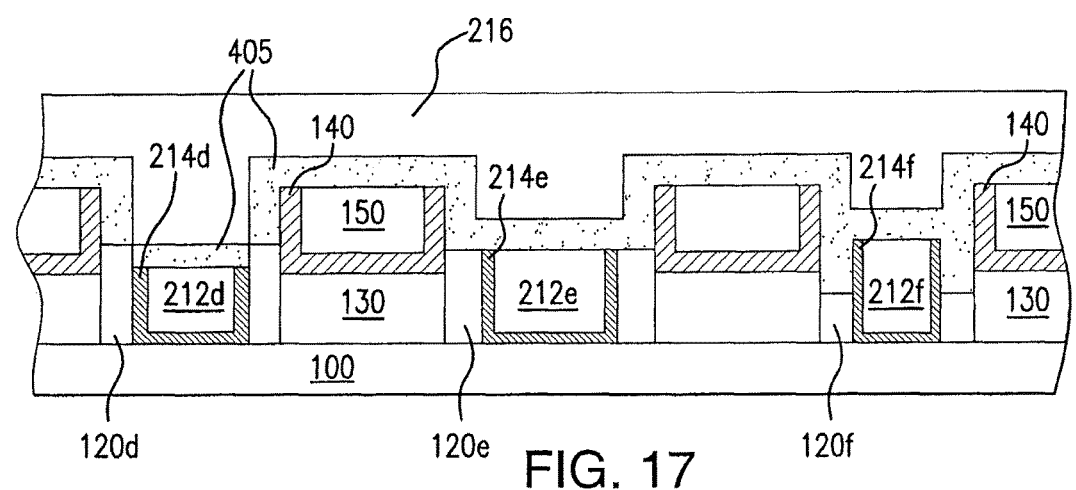

FIG. 17 is a schematic diagram showing a semiconductor device after a deposition of a mask material 216. A deposition process, such as a chemical vapor deposition process, may be to deposit the mask material 216. The mask material 216 may completely cover the high-k dielectric material 405. Preferably, the composition of the mask material 216 may include a silicon carbon nitride, a silicon oxynitride, a silicon nitride, or a silicon carbide, which is different from that of the first interlayer dielectric layer 150. In this way, a required etching selectivity may be defined among these layers.

Figure 18:
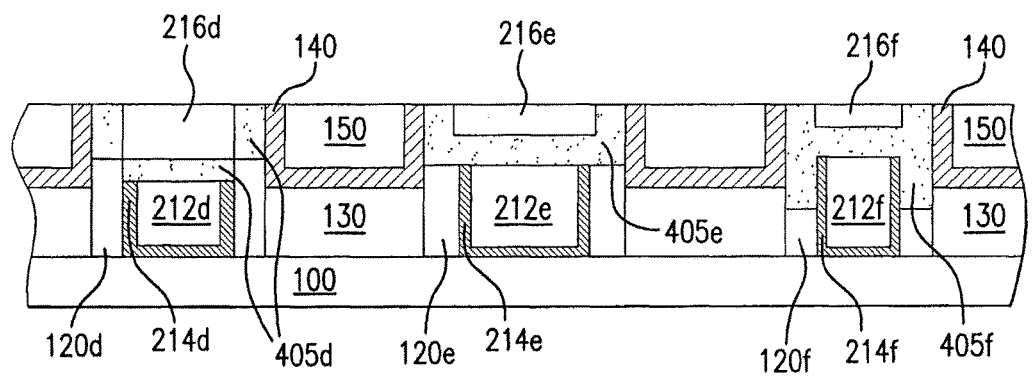

FIG. 18 is a schematic diagram showing a semiconductor device after removing the upper portions of the mask material 216 to expose the first interlayer dielectric layer 150. A photolithographic process and an etching process may be carried sequentially. In this way, only the mask materials filling the inner sidewalls of the high-k dielectric material 405d, 405e, 405f remains, e.g., 216d, 216e, 216f. According to an aspect of the present invention, the remaining mask materials 216d, 216e, 216f may be, if desired, a multi-layered structure, such as a structure including an organic dielectric layer (ODL)/an anti-reflective layer/a photoresist layer sequentially stacked from bottom to top. Additionally, the photolithographic process and/or the etching process preferably adopt a double patterning technology (DPT).

The remaining mask materials 216d, 216e, 216f may cover the underneath gate electrodes 212d, 212e, 212f, dielectric layers 214d, 214e, 214f, as well as high-k dielectric materials 405d, 405e, 405f. This structure affords additional isolation of the gate electrodes 212d, 212e, 212f and the dielectric layers 214d, 214e, 214f from a self-aligned contact structure, as described in more detail below.

Figure 19:
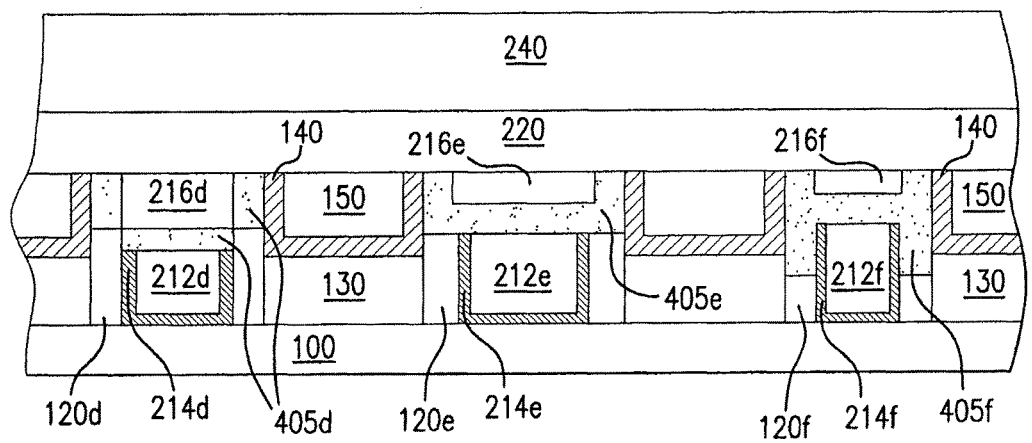

FIG. 19 is a schematic diagram showing a semiconductor device after the deposition of a mask layer 220 and a second interlayer dielectric layer 240. After the removal of the upper portions of the mask material 216, a deposition process, such as a chemical vapor deposition process, may be implemented to form a mask layer 220 with a thickness ranging from 200 Angstrom to 400 Angstrom, and preferably about 350 Angstrom. Preferably, the composition of the mask layer 220 may include a silicon carbon nitride, a silicon oxynitride, a silicon nitride, or a silicon carbide, which is different from that of the first interlayer dielectric layer 150. In this way, a required etching selectivity may be defined among these layers.

The second interlayer dielectric layer 240, such as a pre-metal dielectric (PMD), may be deposited blankly to completely cover the mask layer 220. The composition of the second interlayer dielectric layer 240 may be similar to that of the first interlayer dielectric layer 150, such as a silicon oxide, so that there are the same or similar etching rates between the layers.

FIGS. 20-22 are schematic diagrams showing semiconductor devices after the forming of self-aligned contact structures according to an aspect or aspects of the prevent invention. Subsequent to the formation of the second interlayer dielectric layer 240 in FIG. 19, a photolithographic process and an etching process are carried out to form a contact hole 242d, 242e, 242f in the second interlayer dielectric layer 240, the mask layer 220, and the first interlayer dielectric layer 150. The contact hole 242d, 242e, 242f may expose the epitaxial layers 130d, 130e, 130f or the substrate 100 disposed between each of the gate electrodes 212d, 212e, 212f.

According to an aspect of the present invention, there is a certain etching selectivity among the mask layer 220, the remaining mask materials 216d, 216e, 216f, high-k dielectric material 405d, 405e, 405f, the low-k dielectric gate spacers 120d, 120e, 120f, the etch stop layers 140d, 140e, 140f, the second interlayer dielectric layer 240, and the first interlayer dielectric layer 150. For instance, with the selected etchants and etching recipes, the etching rates of the mask layer 220, the remaining mask materials 216d, 216e, 216f, the high-k dielectric materials 405d, 405e, 405f, the low-k dielectric gate spacers 120d, 120e, 120f, and the etch stop layers 140d, 140e, 140f may be lower than the etching rates of the second interlayer dielectric layer 240 and the first interlayer dielectric layer 150. Accordingly, only a small amount of the mask layer 220, the remaining mask materials 216d, 216e, 216f, the high-k dielectric materials 405d, 405e, 405f, the low-k dielectric gate spacers 120d, 120e, 120f, and the etch stop layers 140d, 140e, 140f, may be removed during the etching process. Thus, even if misalignment occurs during the photolithographic process, the contact holes 242d, 242e, 242f may only expose the epitaxial layers 130d, 130e, 130f or the substrate 100 rather than the gate electrodes 212d, 212e, 212f. The etchants described above may be chosen from suitable gas etchants, such as $C_4F_6$, $C_5F_8$, $O_2$, Ar, CO, $CH_2F_2$, or a mixture thereof.

As shown in FIGS. 20-22, a self-aligned silicidation process is carried out to form metal silicides 244d, 244e, 244f in the epitaxial layers 130d, 130e, 130f. Subsequently, a self-aligned contact process is performed to fill barrier layers 245d, 245e, 245f and metal layers 246d, 246e, 246f into the contact holes 242d, 242e, 242f to form self-aligned contact structures 243d, 243e, 243f. The self-aligned contact structures 243d, 243e, 243f may, if desired, directly contact the remaining mask materials 216d, 216e, 216f, the high-k dielectric material 405d, 405e, 405f, the low-k dielectric gate spacers 120d, 120e, 120f, the etch stop layers 140d, 140e, 140f, the second interlayer dielectric layer 240, and the first interlayer dielectric layer 150, and electrically connect the underneath metal silicides 244d, 244e, 244f. Alternatively, the self-aligned contact structure may form a contact with the substrate, wherein a metal silicide is formed at the interface of the self-aligned contact structure and the substrate (not shown).

The metal silicides 244d, 244e, 244f may be a silicide, and the metal element of the silicide may be selected from the group consisting of tungsten (W), aluminum (Al), copper (Cu), titanium (Ti), tantalum (Ta), niobium (Nb), erbium (Er), molybdenum (Mo), cobalt (Co), nickel (Ni), platinum (Pt), or alloys thereof. The self-aligned contact structure 243 may be selected from the group consisting of tungsten (W), aluminum (Al), titanium (Ti), copper (Cu), molybdenum (Mo), cobalt (Co), platinum (Pt), or alloys thereof. The barrier layers 245d, 245e, 245f include titanium nitride (TiN), tantalum nitride (TaN), Ti/TiN or Ta/TaN, but are not necessarily limited thereto.

FIGS. 23-25 are schematic, cross-sectional diagrams showing a method for fabricating a semiconductor device according to yet another aspect or aspects of the present invention, and a semiconductor device formed according to yet another aspect or aspects of the present invention. To the extent the description accompanying FIGS. 1-10 and FIGS. 15-22 is applicable to FIGS. 23-25, the description is applicable to the aspect or aspects of the present invention illustrated in FIGS. 23-25.

For instance, after the formation of the substrate 100, the low-k dielectric gate spacers 120, the epitaxial layer 130, the etch stop layer 140, the first interlayer dielectric layer 150, and the gate structure 310, including a gate electrode 212 and a dielectric layer 240, as illustrated above in FIG. 1 and FIG. 2, and according to the methods and processes described in the texts related to FIG. 1 and FIG. 2, portions of the etch stop layers 140 may be removed with low-k dielectric gate spacers 120.

FIGS. 23-25 illustrate contact holes 242i, 242j, 242k formed on a semiconductor device, respectively, where the portions of the etch stop layers 140 are removed with portions of the low-k dielectric gate spacers 120. As illustrated, portions of the etch stop layers 140 may be recessed as much as the low-k dielectric gate spacers 120. According to yet another aspect of the present invention, portions of the etch stop layers 140 may be more or less recessed than the low-k dielectric gate spacers 120.

FIG. 23 illustrates a semiconductor device where a gate electrode 212i and dielectric layer 214i is recessed more than a low-k dielectric spacer 120i so that the upper surface of the gate electrode 212i and the dielectric layer 214i is lower than an upper surface of the low-k dielectric gate spacer 120i. An etch stop layer 140i is recessed with the upper portion of the low-k dielectric gate spacer 120i so that the upper surface of the epitaxial layer 130 is in direct contact with a high-k dielectric material 405i. As described in relation to FIGS. 16-18, the high-k dielectric material 405i and a mask material 216i may be formed over a semiconductor device before the formation of the mask layer 220 and the second interlayer dielectric layer 240. The contact hole 242i may be formed to expose the epitaxial layer 130i or the substrate 100 (not shown). A self-aligned silicidation process is carried out to form a metal silicide 244i in the epitaxial layer 130i. A metal layer 246i of the self-aligned contact structure 243i electrically connects the metal silicide 244i underneath a barrier layer 245i.

FIG. 24 illustrates a semiconductor device where a gate electrode 212j and dielectric layer 214j may be recessed as much as the low-k dielectric gate spacer 120j so that an upper surface of the gate electrode 212j and the dielectric layer 214j is substantially level to an upper surface of the low-k dielectric gate spacer 120j. An etch stop layer 140j is recessed with the upper portion of the low-k dielectric gate spacer 120j so that the upper surface of the recessed etch stop layer 140j substantially level the upper surface of the low-k dielectric gate spacer 120j. As described in relation to FIGS. 16-18, the high-k dielectric material 405j and a mask material 216j may be formed over a semiconductor device before the formation of the mask layer 220 and the second interlayer dielectric layer 240. The contact hole 242j may be formed to expose the epitaxial layer 130j or the substrate 100 (not shown). A self-aligned silicidation process is carried out to form a metal silicide 244j in the epitaxial layer 130j. A metal layer 246j of the self-aligned contact structure 243j electrically connects the metal silicide 244j underneath a barrier layer 245j.

FIG. 25 illustrates a semiconductor device where a gate electrode 212k and dielectric layer 214k may be recessed less than the low-k dielectric gate spacer 120k so that an upper surface of the gate electrode 212k and the dielectric layer 214k is higher than an upper surface of the low-k dielectric gate spacer 120k. An etch stop layer 140k is recessed with the upper portion of the low-k dielectric gate spacer 120k so that the upper surface of the epitaxial layer 130 is in direct contact with a high-k dielectric material 405k. The lower surface of the high-k dielectric material 405k is also in direct contact with the upper surface of the recessed low-k dielectric gate spacer 120k. As described in relation to FIGS. 16-18, the high-k dielectric material 405k and a mask material 216k may be formed over a semiconductor device before the formation of the mask layer 220 and the second interlayer dielectric layer 240. The contact hole 242k may be formed to expose the epitaxial layer 130k or the substrate 100 (not shown). A self-aligned silicidation process is carried out to form a metal silicide 244k in the epitaxial layer 130k. A metal layer 246k of the self-aligned contact structure 243k electrically connects the metal silicide 244k underneath a barrier layer 245k.

Figure 26:
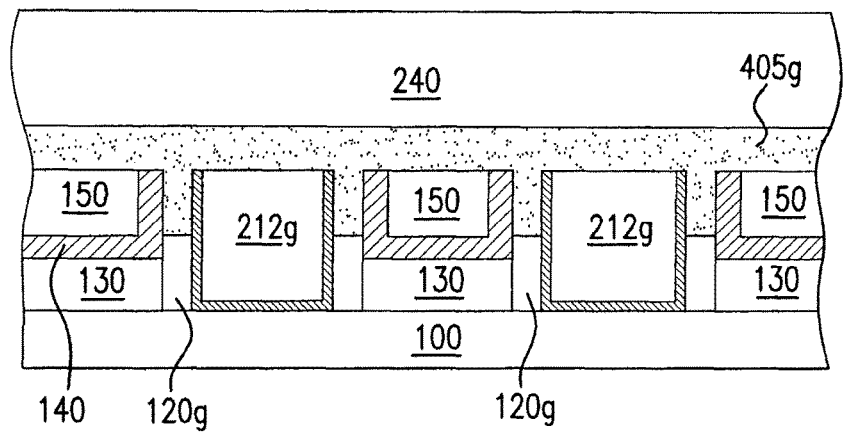
Figure 27:
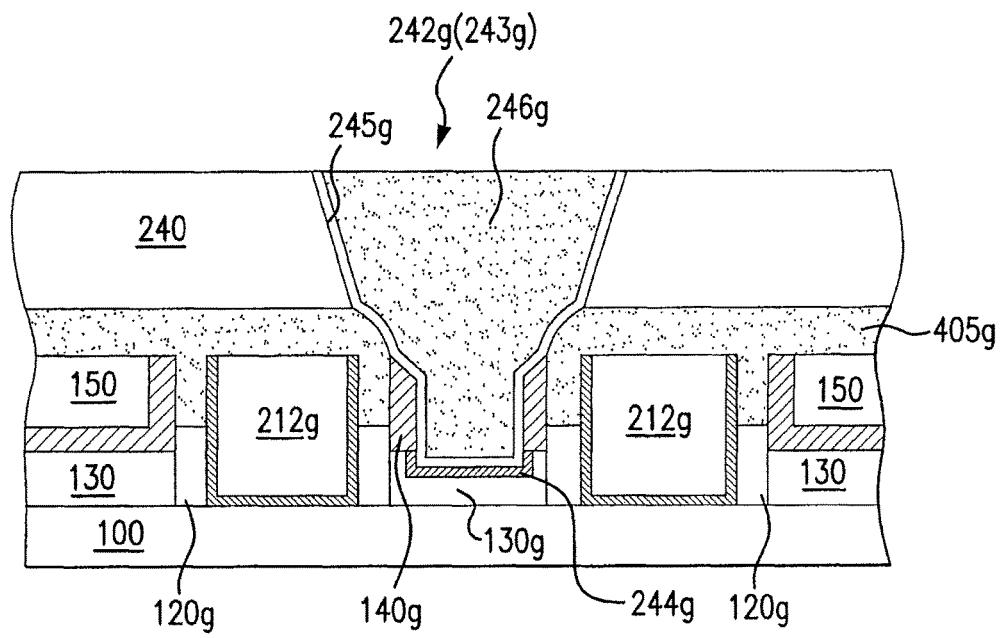

FIG. 26 and FIG. 27 are schematic, cross-sectional diagrams showing a method for fabricating a semiconductor device according to yet another aspect or aspects of the present invention, and a semiconductor device formed according to yet another aspect or aspects of the present invention. To the extent the description accompanying FIGS. 1-10 is applicable to FIGS. 26-27, the description is applicable to the aspect or aspects of the present invention illustrated in FIGS. 26-27.

For, instance, after the formation of the substrate 100, the low-k dielectric gate spacers 120, the epitaxial layer 130, the etch stop layer 140, the first interlayer dielectric layer 150, and the gate structure 310, including a gate electrode 212 and a dielectric layer 240, as illustrated above in FIG. 1 and FIG. 2, and according to the methods and processes described in the texts related to FIG. 1 and FIG. 2, the low-k dielectric gate spacers 120 may be removed as illustrated above in FIG. 3, and according to methods and processes described in the texts related to FIG. 3. Alternatively, as described in relation to FIG. 28, the etch stop layers 140 may be removed with the low-k dielectric gate spacers 120.

FIG. 26 is a schematic diagram showing a semiconductor device after depositing a high-k dielectric material 405g over an upper surface of the first interlayer dielectric layer 150, low-k dielectric gate spacers 120g, gate electrodes 212g, and dielectric layer 214g, and after depositing a second interlayer dielectric layer 240. A deposition process, such as a physical vapor deposition process, may be carried out to form the high-k dielectric material 405g and the second interlayer dielectric layer 240. The high-k dielectric material 405g may be selected from the group consisting of hafnium oxide ($HfO_2$), hafnium silicon oxide (HfSiO), hafnium silicon oxynitride (HfSiON), aluminum oxide ($Al_2O_3$), lanthanum oxide ($La_2O_3$), lanthanum aluminum oxide (LaAlO), tantalum oxide (TaZOS), zirconium oxide (ZrOZ), zirconium silicon oxide ($ZrSiO_4$), hafnium Zirconium oxide (HerO), strontium bismuth tantalite ($SrBi_2Ta_2Og$, SBT), lead zirconate titanate ($PbZrTi_{1-x}O_3$, PZT), and barium strontium titanatev ($Ba_xSr_{1-x}TiO_3$, BST). Additionally, the work function metal layers include titanium nitride (TiN), titanium carbide, (TiC), tantalum nitride (TaN), tantalum carbide (TaC), tungsten carbide (WC), or aluminum titanium nitride (TiAN), but are not limited thereto. The gate electrode 212g may include a metal or a metal oxide with superior filling ability and relative low resistance, such as aluminum (Al), titanium aluminum (TiAl), titanium aluminum oxide (TiAlO), tungsten (W), or copper (Cu), but not limited thereto.

The second interlayer dielectric layer 240, such as a pre-metal dielectric (PMD), may be deposited blankly to completely cover the high-k dielectric material 405g. The composition of the second interlayer dielectric layer 240 may be similar to that of the first interlayer dielectric layer 150, such as a silicon oxide, so that there is the same or similar etching rate between them.

FIG. 27 is a schematic diagram of a semiconductor device after the formation of a self-aligned contact structure. Subsequent to the forming of the second interlayer dielectric layer 240 (FIG. 26), a photolithographic process and an etching process may be carried out to form a contact hole 242g in the second interlayer dielectric layer 240 and the first interlayer dielectric layer 150. The contact hole 242g may expose the epitaxial layer 130g or the substrate 100 disposed between each of the gate electrodes 212g.

According to an aspect of the present invention, there is a certain etching selectivity among high-k dielectric material 405g, the low-k dielectric gate spacer 120g, the etch stop layers 140g, the second interlayer dielectric layer 240, and the first interlayer dielectric layer 150. For instance, with the selected etchants and etching recipes, the etching rates of the high-k dielectric materials 405g, the low-k dielectric gate spacer 120g, and the etch stop layer 140g may be lower than the etching rates of the second interlayer dielectric layer 240 and the first interlayer dielectric layer 150. Accordingly, only a small amount of the high-k dielectric material 405g, the low-k dielectric gate spacer 120g, and the etch stop layer 140g may be removed during the etching process. Thus, even if a misalignment occurs during the photolithographic process, the contact holes 242g may only expose the epitaxial layer 130g or the substrate 100 and not the gate electrode 212g. The etchants described above may be chosen from suitable gas etchants, such as $C_4F_6$, $C_5F_8$, $O_2$, Ar, CO, $CH_2F_2$, or a mixture thereof, but are not necessarily limited thereto.

FIG. 27 is a schematic diagram showing a structure of a semiconductor device after the formation of a self-aligned contact structures 243g according to an aspect of the present invention. As shown in FIG. 26, a self-aligned silicidation process is carried out to form a metal silicide 244g in the epitaxial layer 130g. Subsequently, a self-aligned contact process is performed to fill a barrier layer 245g, and metal layer 246g into the contact hole 242g so as to form self-aligned contact structure 243g. The self-aligned contact structure 243g may directly contact the high-k dielectric material 405g, the low-k dielectric gate spacer 120g, the etch stop layer 140g, the second interlayer dielectric layer 240, and the first interlayer dielectric layer 150, and electrically connect the underneath metal silicide 244g, but is not limited thereto. Alternatively, the self-aligned contact structure may form a contact with the substrate, wherein a metal silicide is formed at the interface of the self-aligned contact structure and the substrate (not shown).

The metal silicide 244g may be a silicide, and a metal element of the silicide may be selected from the group consisting of tungsten (W), aluminum (Al), copper (Cu), titanium (Ti), tantalum (Ta), niobium (Nb), erbium (Er), molybdenum (Mo), cobalt (Co), nickel (Ni), platinum (Pt), or alloys thereof. The self-aligned contact structure 243, may be selected from the group consisting of tungsten (W), aluminum (Al), titanium (Ti), copper (Cu), molybdenum (Mo), cobalt (Co), platinum (Pt), or alloys thereof. The barrier layer 245g includes titanium nitride (TiN), tantalum nitride (TaN), Ti/TiN, or Ta/TaN, but is not necessarily limited thereto.

According to an aspect of the present invention illustrated in FIG. 26 and FIG. 27, the step of forming a mask layer may be eliminated from the fabricating method. According to the aspect of the invention, the process of fabricating may cost less and be faster than a fabricating process including the step of forming a mask layer. Alternatively, a mask layer may be formed on the high-k dielectric material 405g without the steps of etching the upper portions of the high-k dielectric material 405g to expose the first interlayer dielectric layer 150. Accordingly, the process of fabricating may cost less and be faster than a fabricating process including the step of etching the upper portions of the high-k dielectric material to expose the first interlayer dielectric layer 150.

Figure 28:
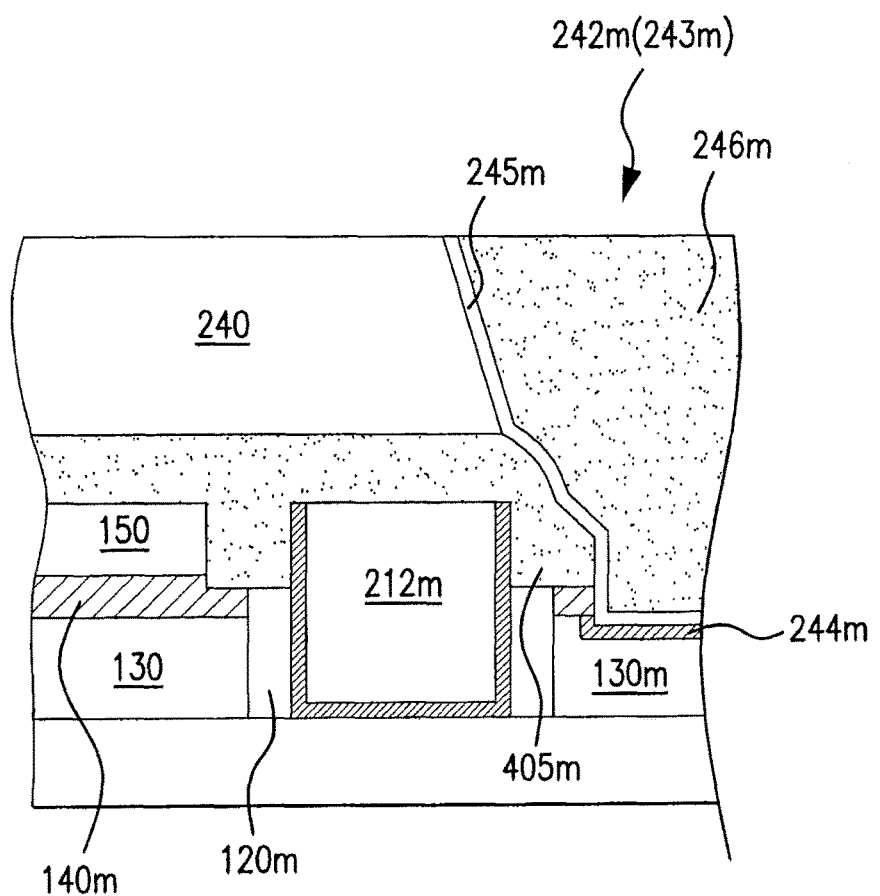
FIG. 28 is a schematic, cross-sectional diagram showing a semiconductor device according to yet another aspect of the present invention.

FIG. 28 is a schematic, cross-sectional diagram of a semiconductor device formed according to yet another aspect or aspects of the present invention. To the extent the description accompanying FIGS. 1-10 and FIGS. 26-27 is applicable to FIG. 28, the description is applicable to the aspect or aspects of the present invention illustrated in FIG. 28.

For instance, after the formation of the substrate 100, the low-k dielectric gate spacers 120, the epitaxial layer 130, the etch stop layer 140, the first interlayer dielectric layer 150, and the gate structure 310, including a gate electrode 212 and a dielectric layer 240, as illustrated above in FIG. 1 and FIG. 2, and according to the methods and processes described in the texts related to FIG. 1 and FIG. 2, portions of the etch stop layers 140 may be removed with the portions of the low-k dielectric gate spacers 120.

FIG. 28 illustrates an recessed etch stop layer 140m of FIG. 28, where the upper portion of the low-k dielectric gate spacer 120m is also recessed so that the upper surface of the etch stop layer 140m adjacent to the recessed low-k dielectric gate spacer 120m substantially level the upper surface of the low-k dielectric gate spacers 120m. As described in relation to FIGS. 26 and 27, a high-k dielectric material 405m and may be formed over a semiconductor device, including a gate electrode 212m, and subsequently, a second interlayer dielectric layer 240 is formed. A contact hole 242m may be formed to expose the epitaxial layer 130m or the substrate 100 (not shown). A self-aligned silicidation process is carried out to form a metal silicide 244m in the epitaxial layer 130m. A metal layer 246m of the self-aligned contact structure 243m electrically connects the metal silicide 244m underneath a barrier layer 245m.

Those skilled in the art will readily observe that numerous modifications and alterations of a semiconductor device and a method of fabricating the same may be made while retaining the teachings of the various aspects of the present invention. Accordingly, the above disclosure should be construed as limited only by the metes and bounds of the appended claims.

What is claimed is:
1. A semiconductor device comprising:
a substrate;
a gate structure on a channel portion of the substrate;
two gate spacers adjacent to two sides of the gate structure;
a first high-k dielectric material layer directly on an upper surface of the gate spacers;
a second high-k dielectric material layer directly on an upper surface of the gate structure; and
a mask material layer disposed directly on the second high-k dielectric layer, wherein a top surface of the first high-k dielectric material layer is leveled with a top surface of the mask material layer, and the mask material layer comprising a dielectric material being different from that of the first high-k dielectric material layer and the second high-k dielectric material layer and the first high-k dielectric material layer and the second high-k dielectric material layer comprising a same dielectric material.

2. The semiconductor device of claim 1, wherein the mask material layer is within inner sidewalls of the first high-k dielectric material layer.

3. The semiconductor device of claim 2, wherein a bottom surface of the first high-k dielectric material is higher than a bottom surface of the second high-k dielectric material.

4. The semiconductor device of claim 2, wherein a bottom surface of the first high-k dielectric material layer is lower than a bottom surface of the second high-k dielectric material layer.

5. The semiconductor device of claim 2, wherein a bottom surface of the first high-k dielectric material is level to a bottom surface of the second high-k dielectric material.

6. The semiconductor device of claim 1, wherein the upper surface of the gate spacers is higher than the upper surface of the gate structure.

7. The semiconductor device of claim 6, further comprising a self-aligned contact structure directly contacting a sidewall of the first high-k dielectric material.

8. The semiconductor device of claim 1, wherein the upper surface of the gate spacers is lower than the upper surface of the gate structure.

9. The semiconductor device of claim 8, further comprising a self-aligned contact structure directly contacting the first high-k dielectric material layer.

10. The semiconductor device of claim 1, wherein the upper surface of the gate spacers is level to the upper surface of the gate structure.

11. The semiconductor device of claim 10, further comprising a self-aligned contact structure directly contacting a sidewall of the first high-k dielectric material.

12. The semiconductor device of claim 1, further comprising a self-aligned contact structure directly contacting the first high-k dielectric material layer.

13. The semiconductor device of claim 1, further comprising an etch stop layer directly contacting a sidewall of the first high-k dielectric material layer.

14. The semiconductor device of claim 13, wherein a bottom surface of the etch stop layer is level to a bottom surface of the second high-k dielectric material.

15. The semiconductor device of claim 13, further comprising a self-aligned contact structure directly contacting a sidewall of the etch stop layer.

* * * * *